(12) United States Patent
Torabi et al.

(10) Patent No.: US 11,761,994 B2
(45) Date of Patent: Sep. 19, 2023

(54) METHOD AND APPARATUS FOR DETECTING FAULTS USING CURRENT UNBALANCE (71) Applicant: Smart Wires Inc., Union City, CA (US)

(72) Inventors: Niloofar Torabi, Menlo Park, CA (US); Hamed Khalilinia, Hayward, CA (US)

(73) Assignee: Smart Wires Inc., Durham, NC (US)

( * ) Notice: Subject to any disclaimer, the term of this patent is extended or adjusted under 35 U.S.C. 154(b) by 29 days.

(21) Appl. No.: 17/444,935

(22) Filed: Aug. 12, 2021

(65) Prior Publication Data
US 2022/0091165 A1 Mar. 24, 2022

Related U.S. Application Data (60) Provisional application No. 62/706,941, filed on Sep. 18, 2020.

(51) Int. Cl.
*G01R 19/25* (2006.01)
*G01R 31/08* (2020.01)

(52) U.S. Cl.
CPC ....... *G01R 19/2513* (2013.01); *G01R 31/085* (2013.01)

(58) Field of Classification Search
CPC .. G01R 19/2513; G01R 31/085; G01R 29/16; G01R 31/58; H02H 1/0092; H02H 3/343
See application file for complete search history.

(56) References Cited

U.S. PATENT DOCUMENTS

| 8,067,932 B2 | 11/2011 | Teodorescu et al. |
| 8,717,721 B2 | 5/2014 | Rostron |
| 9,379,602 B2 | 6/2016 | Zhu et al. |

(Continued)

FOREIGN PATENT DOCUMENTS

| CN | 101617234 B | 5/2012 |
| DE | 102014223441 B4 | 7/2016 |

(Continued)

OTHER PUBLICATIONS

Mihai Ciobotaru, et al., "A New Single-Phase PLL Structure Based on Second Order Generalized Integrator", 37th IEEE Power Electronics Specialists Conference, PESC '06, 2006, pp. 361-366.

(Continued)

*Primary Examiner* — Feba Pothen
(74) *Attorney, Agent, or Firm* — Womble Bond Dickinson (US) LLP (57) ABSTRACT

A fault detection system has line current monitors. Each line current monitor couples to a line-phase of an electric power transmission system. Each line current monitor has a phase detector, a loop filter and a controlled oscillator, coupled as a phase locked loop. The phase detector has a rotating frame transform. The phase detector couples to a line-phase and provides in-phase and quadrature signals in a rotating frame, based on in-phase and quadrature signals proportional to current in the line-phase. One or more fault detection modules are coupled to the line current monitors through inter-phase communication of the in-phase and quadrature signals in a time frame rotating at the line frequency. The communication may have electrical isolation.

22 Claims, 7 Drawing Sheets

(56) References Cited

U.S. PATENT DOCUMENTS

| | | | |
|---|---|---|---|
| 2007/0005194 A1 | 1/2007 | Chang et al. | |
| 2010/0088049 A1* | 4/2010 | Lu | G01R 21/1331 324/76.23 |
| 2012/0169059 A1 | 7/2012 | Beekmann et al. | |
| 2018/0152022 A1* | 5/2018 | Manson | H02J 3/381 |
| 2018/0348288 A1* | 12/2018 | Zhang | H02J 3/38 |
| 2019/0245343 A1* | 8/2019 | Porter | H02H 3/42 |
| 2020/0195009 A1 | 6/2020 | Kovalsky et al. | |
| 2020/0319240 A1* | 10/2020 | Hao | G01R 31/088 |
| 2021/0083679 A1* | 3/2021 | Yang | H03L 7/07 |

FOREIGN PATENT DOCUMENTS

| | | |
|---|---|---|
| ES | 2731640 T3 | 11/2019 |
| WO | 2008055499 A2 | 5/2008 |

OTHER PUBLICATIONS

Edith Clarke, "Circuit Analysis of A-C Power Systems, vol. I, Symmetrical and Related Components", J. Wiley and Sons, New York, 1943, 571 pp. total.

Magnus Ohrstrom, et al., "Fast Protection of Strong Power Systems With Fault Current Limiters and PLL-Aided Fault Detection", IEEE Transactions on Power Delivery, vol. 26, No. 3, Jul. 2011, pp. 1538-1544.

R. H. Park, "Two-Reaction Theory of Synchronous Machines, Generalized Method of Analysis—Part I", Transactions of the American Institute of Electrical Engineers, vol. 48, No. 3, Jul. 1929, pp. 716-727.

Wenbin Qiu, et al., "An Islanding Detection based on Virtual Impedance and Phase-Locked Loop", Proceedings of the 36th Chinese Control Conference (CCC), Dalian, China, Jul. 26-28, 2017, pp. 10553-10558.

Guangyu Sun, et al., "A Novel Low Voltage Ride-Through Technique of Three-Phase Grid-Connected Inverters Based on a Nonlinear Phase-Locked Loop", IEEE Access, vol. 7, Digital Object Identifier 10.1109/ACCESS.2019.291.2859, Apr. 23, 2019, pp. 66609-66622.

Andreas Uphues, et al., "SOGI based grid fault detection for feeding asymmetrical reactive currents to fulfill LVRT requirements", Africon, Pointe-Aux-Piments, 2013, pp. 1-5.

Mian Wang, et al., "Magnitude Detection and Phase Synchronization of Unbalanced and Distorted Grid Voltage with Novel Extended PLL Loop Filter", 2015 IEEE 11th International Conference on Power Electronics and Drive Systems, Sydney, Australia, Jun. 9-12, 2015, pp. 208-213.

Wei Zhao, et al., "Microgrid Relay Protection Scheme Based on Harmonic Footprint of Short-Circuit Fault," Chinese Journal of Electrical Engineering, vol. 4, No. 4, Dec. 2018, pp. 64-70.

\* cited by examiner

Figure 1

| Fault Type | Resistance | | Description |
|---|---|---|---|
| $\overline{A}\,\overline{B}\,\overline{C}$ | RL > 2Ω | | High line impedance fault |
| AG BG CG | RG < 1 Ω | | Metallic short of any phase to ground |
| | RG > 1 Ω | | Resistive short of any phase to ground |
| AB BC CA | RP < 1 Ω | | Metallic phase to phase short |
| | RP > 1 Ω | | Resistive phase to phase short |
| ABG BCG CAG | RP < 1 Ω | RG < 1 Ω | Two phases shorted with metallic short to ground |
| | RP < 1 Ω | RG > 1 Ω | Two phases shorted with resistive short to ground |
| ABC | RP < 1 Ω | | All phases shorted |
| ABCG | RP < 1 Ω | RG < 1 Ω | All phases shorted with metallic short to ground |
| | RP < 1 Ω | RG > 1 Ω | All phases shorted with resistive short to ground |

$$I_d = I_\alpha * \cos(\theta) + I_\beta * \sin(\theta)$$
$$I_q = I_\beta * \cos(\theta) - I_\alpha * \sin(\theta)$$

Figure 6

Positive Sequence Equations $$\begin{bmatrix} I_A^+ \\ I_B^+ \\ I_C^+ \end{bmatrix} = \frac{1}{3}\begin{bmatrix} 1 & -0.5 & -0.5 \\ -0.5 & 1 & -0.5 \\ -0.5 & -0.5 & 1 \end{bmatrix}\begin{bmatrix} I_A^d \\ I_B^d \\ I_C^d \end{bmatrix} + \frac{\sqrt{3}}{6}\begin{bmatrix} 0 & -1 & 1 \\ 1 & 0 & -1 \\ -1 & 1 & 0 \end{bmatrix}\begin{bmatrix} I_A^q \\ I_B^q \\ I_C^q \end{bmatrix}$$

Negative Sequence Equations $$\begin{bmatrix} I_A^- \\ I_B^- \\ I_C^- \end{bmatrix} = \frac{1}{3}\begin{bmatrix} 1 & -0.5 & -0.5 \\ -0.5 & 1 & -0.5 \\ -0.5 & -0.5 & 1 \end{bmatrix}\begin{bmatrix} I_A^d \\ I_B^d \\ I_C^d \end{bmatrix} - \frac{\sqrt{3}}{6}\begin{bmatrix} 0 & -1 & 1 \\ 1 & 0 & -1 \\ -1 & 1 & 0 \end{bmatrix}\begin{bmatrix} I_A^q \\ I_B^q \\ I_C^q \end{bmatrix}$$

METHOD AND APPARATUS FOR DETECTING FAULTS USING CURRENT UNBALANCE

CROSS-REFERENCE TO RELATED APPLICATIONS

This application claims benefit of priority from U.S. Provisional Application No. 62/706,941 titled Method for Detecting Faults Using Current Unbalance and filed Sep. 18, 2020, which is hereby incorporated by reference.

TECHNICAL FIELD

The present disclosure relates generally to high voltage, three phase electric power transmission systems; more particularly, to apparatus that is capable of rapidly detecting faults in the power transmission systems.

BACKGROUND

Electrical power transmission represents the backbone of contemporary civilization. While selected inter-regional transmission lines use direct current (DC) from 100 kV to 600 kV for electric power transfer, the overwhelming bulk of power transmission is done with three-phase alternating current at either 50 Hz or 60 Hz. This transmission occurs at voltages ranging from a few thousand volts to 550 kV or more. Using three line-phases, such a transmission system may transport up to 3 GW under ideal conditions.

At all levels, these transmission systems have high integrity. However, faults do happen, and it is critical that any fault be detected, characterized, and isolated as quickly as possible. This is a matter of protecting both the system integrity and public safety. Circuit breakers and fuses have been replaced by sophisticated powerline monitoring systems. There are several examples in recent literature, and to varying degrees, they depend upon analysis techniques pioneered by R. H. Park (for rotating machines) and Edith Clarke.

For instance, "Advanced real-time grid monitoring system," (CN101617234B, May 23, 2012) concentrates on operating frequency and phase angle to assess the health of a transmission link, particularly where one power source might be a wind turbine. "Procedure and device for observing the status of a network," (ES2731640T3, Nov. 18, 2019) also depends upon phase angles of the three line-to-neutral voltages to identify faults within less than single cycle of the AC power.

Another approach was described in "Advanced Real-Time Grid Monitoring System and Method," (U.S. Pat. No. 8,067,932 B2, Nov. 29, 2011), based on addressing sequences in two-phase signals derived from the three-phase trunk. "High Impedance Fault Isolation System," (U.S. Pat. No. 8,717,721B2, May 6, 2014) employs symmetric transforms and a comparison of the negative sequence and the zero sequence amplitudes to infer the presence of a fault.

Yet one more approach, from "Error detection for electrical networks," (DE102014223441B4, Jul. 14, 2016), employs a phase locked loop to create a trio of reference signals against which the in-phase and quadrature components of the three phase voltages are compared. The deviations, particularly seen in the quadrature signals, are detected to signify faults.

Many of these prior art approaches use the Second Order Generalized Integrator (SOGI) to realize phase locked loops. This common approach has been described in detail by Ciobotaru, et al., entitled "A New Single-Phase PLL Structure Based on Second Order Generalized Integrator," 37th IEEE Power Electronics Specialists Conference, 2006. PESC '06 (pp. 361-366).

All of these schemes offer advantages over conceptual fuses or circuit breakers, but they fail in their applicability to high voltage applications, where the line potentials are separated by tens or hundreds of kilovolts, and the lines themselves are physically separated by meters or tens of meters.

Therefore, there is a need in the art for a solution which overcomes the drawbacks described above.

SUMMARY

Various embodiments of a fault detection system and related method are disclosed herein. These fault detection systems and methods are for detecting faults on line-phases of an electric power transmission system.

The fault detectors may be segregated into two functions, the first, a line current monitor, incorporates a phase locked loop (PLL), and it is associated with each line-phase. The input to this PLL is an analog or digital representation of the instantaneous current flowing in the associated line-phase. The PLL function comprises a second order generalized integrator (SOGI), a Park transform block, a loop filter and a voltage-controlled oscillator. The SOGI presents in-phase and quadrature representations of the line-phase current to the Park transform. The Park transform converts in-phase and quadrature representations of the line-phase currents at the line frequency to corresponding signals in a time frame that is rotating at the line frequency. In a steady state, the in-phase and quadrature current signals are invariant, since the line frequency AC component is implicit in the rotating time frame. A line current monitor is dedicated to a single line-phase, meaning that the hardware may have a virtual ground representative of the line-phase voltage.

The second of the two functions, fault detection, provides comparisons among the three pairs of line-phase current signals. This function uses a symmetrical Clarke transform to compare the in-phase and quadrature current representations. The comparison is followed by a thresholding function to distinguish faults. Optionally, the three pairs of signals may be further analyzed to classify the fault. The existence of faults and their nature can be used by a central transmission control system to implement protective and corrective actions.

Since this method of fault detection employs evaluations of current balance among the line-phases, current information must be passed among the line-phases. In this approach, that current information is in the form of in-phase and quadrature quantities expressed in a time frame that rotates at the line frequency. With the predictable AC components removed, these signals carry just the magnitudes of the components, making fault-related changes immediately recognizable by the comparison circuits or logic.

In one embodiment, a fault detection system has line current monitors, one or more inter-phase communication modules coupled to the line current monitors with electrical isolation, and one or more fault detection modules coupled to the inter-phase communication module(s). Each line current monitor is to couple to a line phase of an electric power transmission system. Each line current monitor includes a phase detector, a loop filter and a controlled oscillator, as a phase locked loop. The phase detector has a rotating frame transform, and couples to a line-phase to provide in-phase and quadrature signals in a rotating frame, based on in-phase and quadrature signals proportional to current in the line-phase.

In one embodiment, a fault detection system for line-phases of electric power transmission systems has line current monitors, one or more fault detection modules, and one or more inter-phase communication modules. Each line current monitor has a controlled oscillator, a phase detector and a loop filter, coupled in a phase locked loop. The controlled oscillator produces a reference signal. The phase detector has a second order generalized integrator circuit to couple to a line-phase and provide in-phase and quadrature alternating current signals proportional to current in the line-phase and relative to the reference signal produced by the controlled oscillator. The phase detector has a Park Transformation block coupled to the SOGI circuit to transform the in-phase and quadrature alternating current signals to in-phase and quadrature signals in a rotating frame. The frame is rotating at a nominal line frequency defined by the controlled oscillator. The fault detection module(s) detect error or fault in the line-phases of the electric power transmission system based on the line current monitors. The inter-phase communication module(s) provide electrical isolation and couple the fault detection module(s) and the line current monitors.

In one embodiment, a method of fault detection is performed by a fault detection system. The method includes determining in-phase and quadrature signals proportional to current in a line-phase of an electric power transmission system and relative to a reference signal generated by a controlled oscillator in a phase locked loop, in line current monitors. The method includes transforming the in-phase and quadrature signals to in-phase and quadrature signals in a rotating frame, in the line current monitors. The frame is rotating at a line frequency according to the controlled oscillator. The method includes communicating output of the line current monitors, with electrical isolation, to one or more fault detection modules. The method includes detecting and indicating error of one or more line-phases of the electric power transmission system, through the error detection module(s), based on the output of the current monitors.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

This disclosure discloses a system for rapidly identifying faults in high-voltage, three-phase electric power transmission systems, where the system is characterized by electronics, associated with each of the three high-voltage lines, that create in-phase and quadrature signals in a rotating time frame that represent the currents in the lines. The system also includes a number of modules, such as one or three modules, that use symmetric transforms to create signals representing imbalance conditions among the phases and comparing these signals with adaptive thresholds to sense faults. The same or related signals may be used to classify the faults. The communication among the phases incorporates the in-phase and quadrature signals in a rotating time frame, using radio frequency (RF) or other high-voltage tolerant communication channels.

There are a wide variety of faults that may occur in a three-phase electrical distribution system. With high-tension lines extending across a variety of terrains in a variety of weather conditions, problems can arise. For safety reasons, these problems must be recognized, and their dangerous effects mitigated quickly. This is in the context of a contemporary transmission network, which is controlled centrally to optimize balance and transmission efficiency. Such a system may also be sensitive to faults, and capable of both isolating faults and mitigating the damage or disruption they might provoke. Efficient, and especially prompt, fault detection is key to the ultimate reliability of the transmission system.

Figure 1:
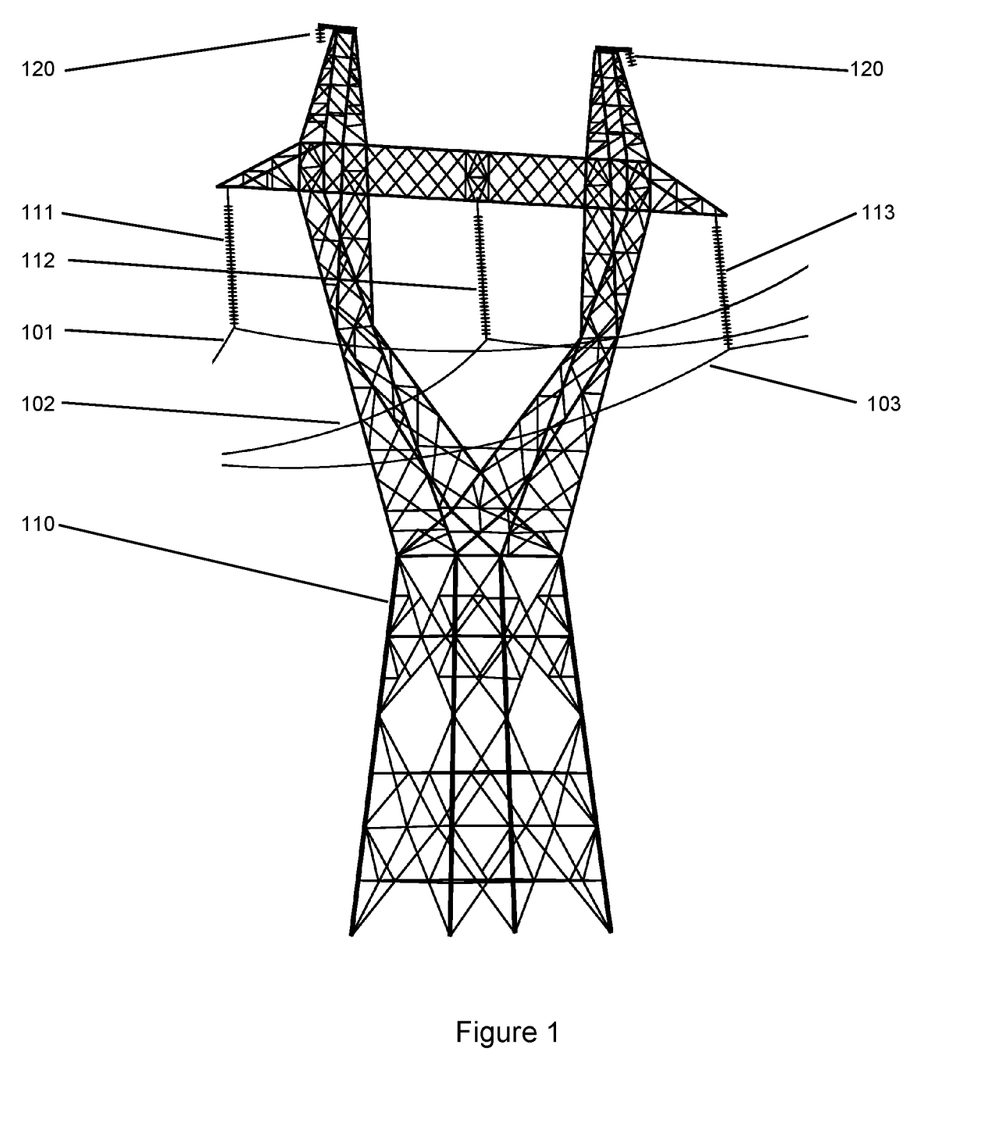
FIG. 1 is an illustration of an example high voltage transmission pylon.

FIG. 1 shows an example pylon 110 with three phase lines 101, 102 and 103. For distribution, less than 35 kV as an example, the spacing between any two lines may be, for example 4 to 6 meters. For extra high voltage transmission, with voltages in excess of 345 kV as an example, the spacing between lines may be, for example 15 to 20 meters. Other features in FIG. 1 include insulators 111, 112, 113 respectively supporting the three phase lines 101, 102, 103, and the locations 120 for ground lines. The descriptions to follow are well suited to this type of physical and electrical environment.

Figure 2:
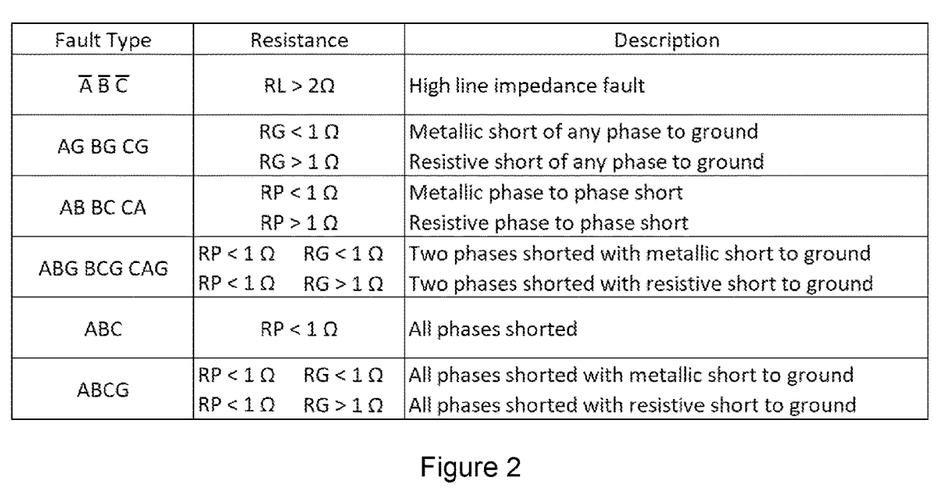
FIG. 2 shows a partial and example list of faults that can occur in a three-phase power transmission system.

FIG. 2 shows a partial list of faults that may appear in a system characterized by line-phases A, B and C. With the exception of fault type ABC, with description "All Phases Shorted," each of the faults can lead to an unbalanced condition among the line-phases. Even the ABC fault can commence with an unbalanced fault condition involving two out of the three line-phases. The apparatus described herein below is configured to detect changes in the balance among the phases swiftly, within a fraction of a cycle.

Figure 3:
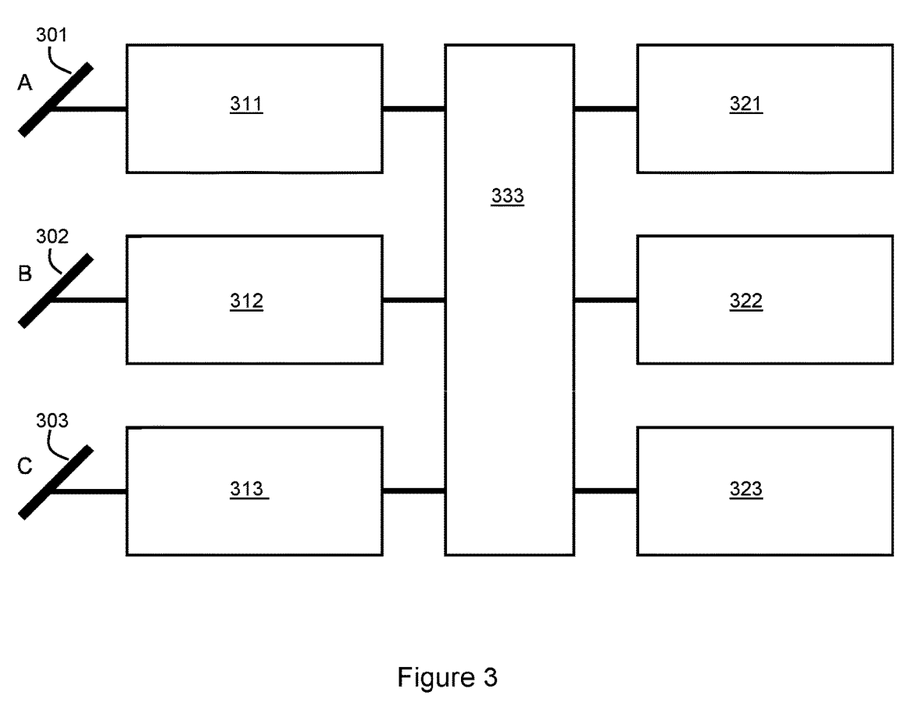
FIG. 3 shows a high-level block diagram of a fault detecting system.

FIG. 3 shows a high-level block diagram of a fault or error detecting system, which monitors lines A, B and C. As shown, transmission line 301 carries line-phase current A, line 302 carries the line-phase current B, and line 303 carries the line-phase current C. The three currents, A, B and C are alternating currents (AC) operating at a frequency, which may be approximately 50 Hz or 60 Hz as an example. Under ideal conditions, each of the currents A, B and C may be equal in magnitude and differ in signal-phase from the other two by +120° and −120° for example. Under actual operation, the three line-phase currents A, B and C may not balance perfectly, and the signal-phase angles may not have their ideal 120° magnitudes. Under fault conditions, the current magnitudes or the current signal-phase angles may change drastically from their stable operating conditions. The system being described is intended to detect such changes in times that are less than a half cycle, e.g., less than 10 msec. or less than 8.33 msec.

Typically, the word "phase" may have at least two different meanings. The first meaning addresses the designation of one of the three lines that comprise the three-phase transmission system. This will generally be designated as a "line-phase," or have the word "line" in close proximity to the word "phase." The other meaning of phase refers to the timing of a given signal relative to some reference, typically described by an angle, e.g., 120°. This will normally be cited as a "signal-phase."

In FIG. 3, line current monitors 311, 312 and 313 include electronics associated with each individual line-phase, which may include line current sensing, analog-to-digital conversion, a phase locked loop, and a rotating frame transform block, all of which will be discussed in detail herein below. In one embodiment, the fault detection modules 321, 322 and 323 can contain electronics dedicated to fault detection, which may include one or more symmetrical transform evaluations, a fault threshold control, a fault detector, and a fault classifier. Finally, inter-phase communication block 333 represents inter-phase communications, which may incorporate radio frequency communications or fiber optic communications. In selected, particularly low voltage, applications, the inter-phase communication may use wired connections, with appropriate isolation. This isolation is essential because each of the blocks may operate at the potentials of their respective line phases. Thus, line current monitor 311 and fault detection module 321 may have a virtual ground connection to line-phase A, line current monitor 312 and fault detection module 322 may have a virtual ground connection to line-phase B, and line current monitor 313 and fault detection module 323 may have a virtual ground connection to line-phase C. These respective virtual grounds can differ in potential, for example by 50 Hz or 60 Hz voltages ranging up to hundreds of thousands of volts.

Figure 4:
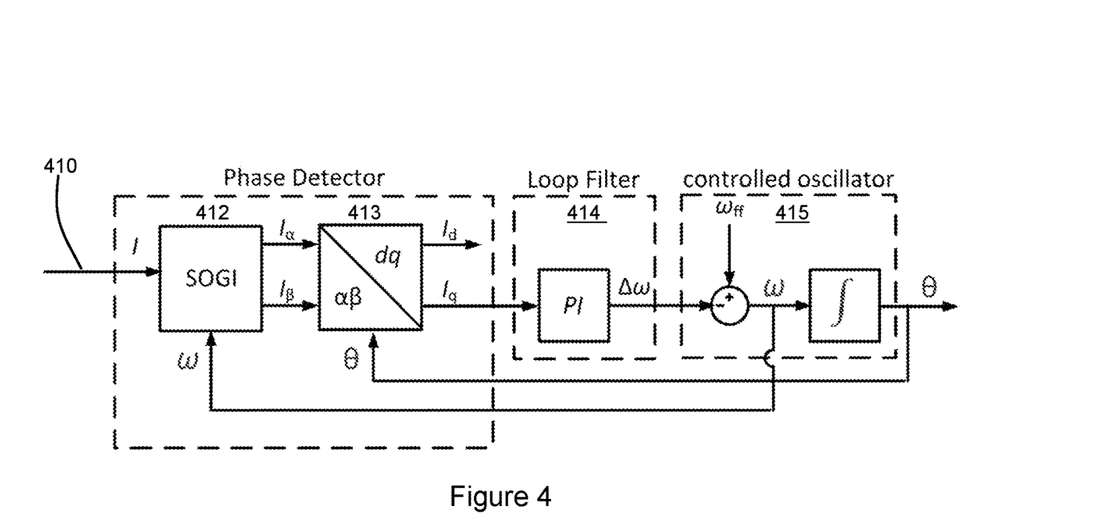
FIG. 4 shows a block diagram of a single-phase, phase-locked loop for a fault detection system.

For each line-phase, there may be a dedicated suite of circuits as illustrated in FIG. 4, which operate on a single phase. As shown, current input signal 410 to phase detector block may be a dynamic signal proportional to the instantaneous current passing through a selected line of the three line-phases comprising the electric power transmission path. This signal may be introduced into a Second Order Generalized Integrator (SOGI) circuit 412. SOGI circuit 412 serves to reliably provide two signals, $I_\alpha$ that is in signal-phase with the signal ω generated by phase-locked oscillator 415 and $I_\beta$ that is 90° out of signal phase with the ω signal. While a SOGI is utilized in the example in FIG. 4, any circuit that provides in-phase $I_\alpha$ and quadrature $I_\beta$ signals relative to a reference signal ω can serve the requirements of the phase detector block. The $I_\alpha$ and $I_\beta$ signals both may be proportional to the amplitude of the current passing through the line, but modified by the signal-phase relative to the local oscillator 415.

The conversion block 413, in one embodiment using a conversion or transformation commonly known as the Park Transformation, effects a transformation of the $I_\alpha$ and $I_\beta$ signals, nominally at the line frequency, to $I_d$ and $I_q$ signals. The $I_d$ and $I_q$ signals are "in-phase" and "quadrature" in a frame which is rotating at the nominal line frequency, as defined by the controlled oscillator 415. In some instances, the "in-phase" signal may be referred to as a "direct" signal, hence the designation $I_d$. The $I_d$ and $I_q$ signals are equivalent to the $I_\alpha$ and $I_\beta$ signals, except $I_d$ and $I_q$ are valid in a frame that is rotating at the nominal line frequency. Since their time frame is rotating, the $I_d$ and $I_q$ signals generally change slowly compared to the AC signals $I_\alpha$ and $I_\beta$. For a truly stable system $I_d$ would be a DC signal proportional to the power line current, and $I_q$ would be zero. However, under fault conditions either the $I_d$ signal or the $I_q$ signal may change rapidly or make a significant excursion from a nominal value.

Figure 6:
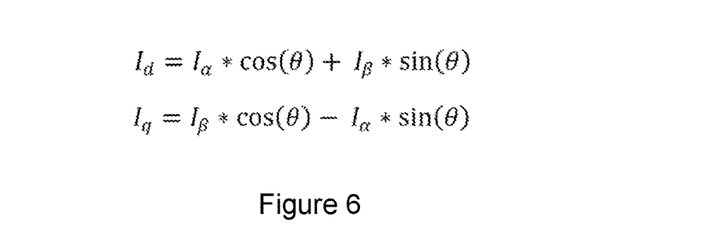
FIG. 6 shows equations that execute the rotating-frame transform in the circuits of FIGS. 4 and 5.

In FIG. 4, Park Transform block 413 may be represented by equations shown in FIG. 6. Variable θ is a time indicator that advances at a rate of 2π a per cycle, in some embodiments. Alternatively, the variable θ may, over the course of a single cycle, pass through the range of 0 to 2π, and then reset to 0, since sin(0) is the same as sin(2π) and cos(0) is the same as cos(2π). The $I_q$ output of the conversion block 413 is passed through a low-pass loop filter 414. The filtered $I_q$ signal acts as a correcting signal Δω to the final block, a controlled oscillator 415. If the signal phase of the oscillator 415 is advanced with respect to signal phase of the current input signal 410, the correcting signal Δω may retard the oscillator 415. Alternatively, if the signal phase of the oscillator 415 is lagging, correcting signal Δω may advance the oscillator 415. In this way, the signal ω is locked to the current input signal 410 in both signal-phase and signal frequency.

In one embodiment, loop filter 414 is a low-pass filter, and the corner frequencies may be 550 Hz to 700 Hz, in some embodiments. Without the loop filter 414, the controlled oscillator frequency may tend to be jittery and interfere with sensing faults.

Anticipating the role that the phase locked loop in FIG. 4 plays, it should be noted that the key output from this block can be the in-phase and quadrature signals in the rotating time frame, $I_d$ and $I_q$, i.e., the output of the Park Transformation.

Figure 5:
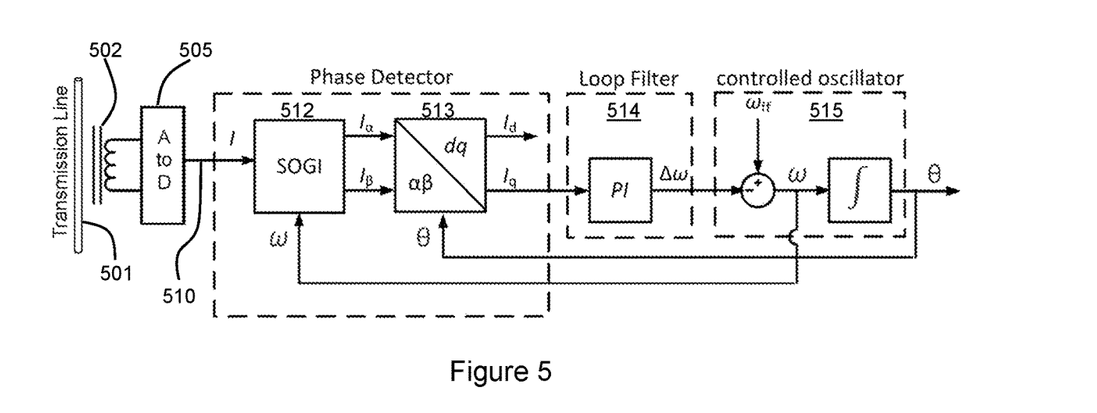
FIG. 5 shows a digital implementation of a single-phase, phase-locked loop for a fault detection system.

FIG. 4 illustrates an analog realization of all the circuit blocks. An alternative approach, allowed by contemporary technology, is to carry out all the functions in a digital domain. This is illustrated in FIG. 5. In this embodiment, transmission line 501 for one of the three line-phases may be positioned in the immediate proximity of a current sensing element. One such current sensing element is an inductor depicted as current sensor 502 that is subjected to the magnetic field created by the current flow in the transmission line 501. Other sensing methods and devices, such as Hall effect and magnetoresistance may also be considered for various embodiments. The output of the current sensor 502 is sampled by an analog-to-digital converter 505, creating a sequence of digital words or values that are proportional to the instantaneous current observed by the current sensor 502. A typical sampling rate may range from 50,000 (1000 samples per cycle at 50 Hz) to 2,000,000 samples per second.

Signal 510 entering SOGI 512 may include a sequence of words (e.g., 8 bits to 16 bits) delivered at the sampling rate. Similarly, $I_\alpha$ and $I_\beta$ exiting the SOGI 512 are sequences of multi-bit words at the sampling frequency. This same format applies to all the signals in the loop filter 514 and the controlled oscillator 515. Most particularly, the signals $I_d$ and $I_q$ in the rotating time frame are also represented by 8-bit to 16-bit words at the sampling frequency. Herein, the word "signal" may refer to an analog variable, but more frequently, it is referred to as a digital representation of an analog value, for example an 8-bit to 16-bit word.

Figure 7:
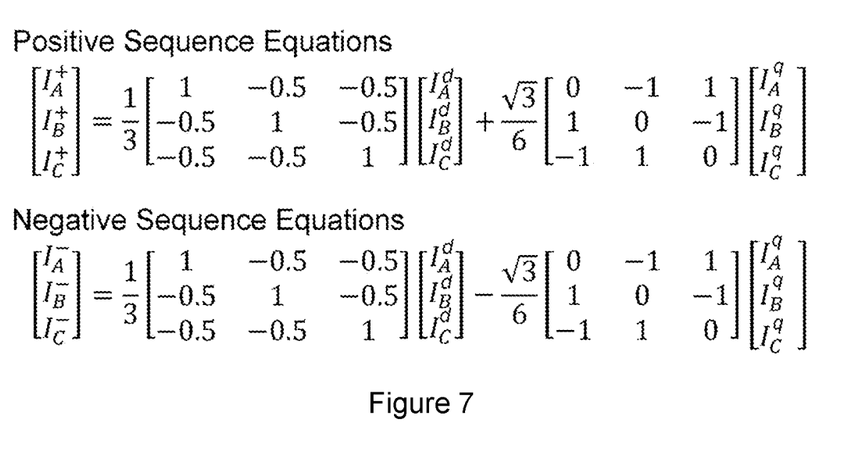
FIG. 7 shows positive and negative three-phase symmetric transforms as matrices.

As indicated by line current monitors 311, 312 and 313 of FIG. 3, the elements described in either FIG. 4 or FIG. 5 are duplicated for each of the three line-phases, A, B and C. Thus, for all three line-phases, there are two signals $I_d$ and $I_q$. One may address the balance among these three phases by drawing on the symmetric transforms first introduced by Edith Clarke in 1943, known as Clarke transforms. Two of the Clarke transforms that may be important for error detection, are shown in FIG. 7. Both transforms use the six in-phase and quadrature signals, $I_d^A$, $I_q^A$, $I_d^B$, $I_q^B$, $I_d^C$, and $I_q^C$ as inputs. The first of the two transforms, "Positive Sequence Equations," delivers components $I_A^+$, $I_B^+$ and $I_C^+$; for a perfectly balanced system, these components would be equal representations of the currents in the three line-phases. The second of the two transforms, "Negative Sequence Equations," delivers components $I_A^-$, $I_B^-$ and $I_C^-$; for a perfectly balanced system, these components would all be zero. In an unbalanced system, their magnitudes would be indicators of the degree of imbalance. As indicators of transmission line faults, the Negative Sequence results may be better indicators of problems, although the Positive Sequence results can also be employed.

Figure 8:
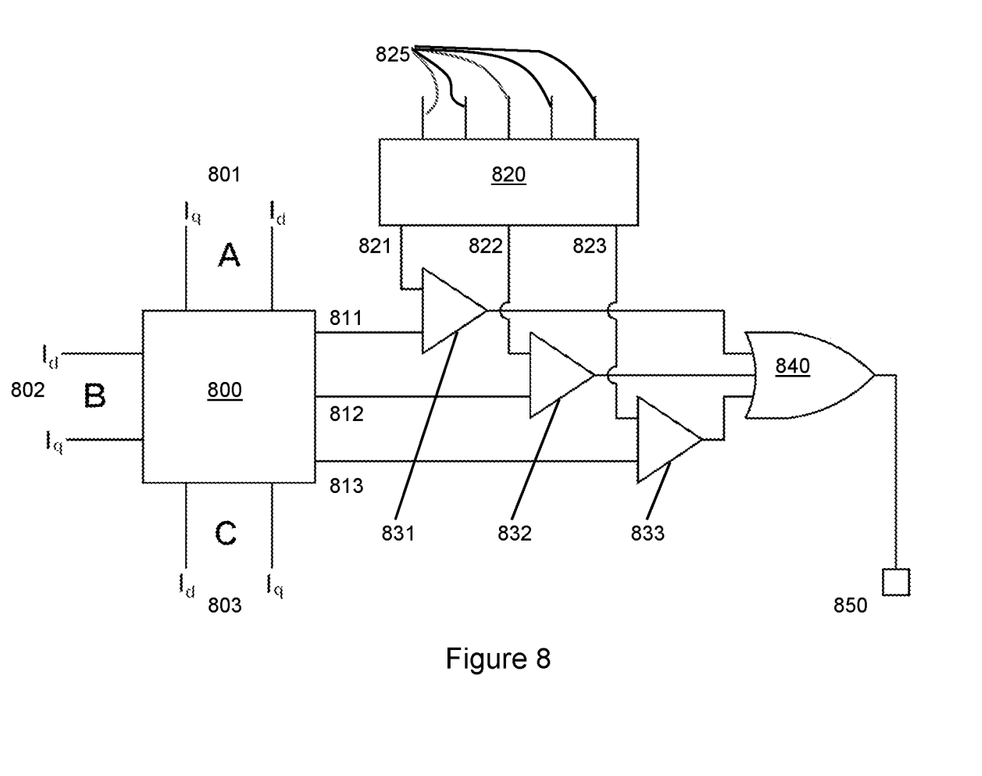
FIG. 8 shows an example method of fault detection based on Negative Sequence components.

One way of identifying faults based upon line imbalance would be to use the Negative Sequence Equations from FIG. 7, a set of thresholds and comparators for each of the $I_A^-$, $I_B^-$ and $I_C^-$ signals, as illustrated in FIG. 8. Block 800 may be a symmetric transform block, for example a Negative Sequence transform. This block converts the $I_d$ and $I_q$ signals from line-phase A 801, the $I_d$ and $I_q$ signals from line-phase B 802, and the $I_d$ and $I_q$ signals from line-phase C 803 into the sequence signals $I_A^-$ 811, $I_B^-$ 812, and $I_C^-$ 813. Each of those signals may form an input to a comparator, respectively identified as comparators 831, 832 and 833 in FIG. 8. Besides the sequence signals $I_A^-$ 811, $I_B^-$ 812, and $I_C^-$ 813, each of the comparators has a reference signal 821, 822 or 823. In one embodiment, comparator 831 may deliver a "TRUE" output if the magnitude of the $I_A^-$ signal 811 exceeds a threshold value on a reference signal 821. Similarly, the comparator 832 may deliver a "TRUE" output if the magnitude of the $I_B^-$ signal 812 exceeds a threshold value on a reference signal 822, and comparator 833 may deliver a "TRUE" output if the magnitude of the $I_C^-$ signals 813 exceeds a threshold value on a reference signal 823. Should any one or more of the comparators shows "TRUE," the OR function indicated by block 840 may deliver a signal to terminal 850 indicating the existence of a fault.

In some embodiments, the comparator may indicate TRUE when the sequence signal is outside of a range having a minimum value and a maximum value. Under normal operation, a certain degree of imbalance may be expected among the three line-phases, and this level of imbalance may vary over time due to changing load or supply conditions in the absence of any fault conditions. It is the role of reference controller 820 to manage the reference signals 821, 822 and 823, either analog or digital in form. Controller 820 may employ one or more inputs 825 to set and adjust the reference signals 821, 822 and 823. Examples of such inputs would be the recent RMS values of the line-phase currents, Positive Sequence values $I_A^+$, $I_B^+$ and $I_C^+$ as computed by the matrices in FIG. 7, Negative Sequence values $I_A^-$, $I_B^-$ and $I_C^-$ as computed by the matrices in FIG. 7, and tolerances, e.g., + or −20%, as programmed into the controller 820 or delivered as an input 825 from a remote system controller. The controller 820 may depend upon recent history of any of the inputs 825 or it may incorporate any one of several artificial intelligence techniques to provide thresholds for reference signals 821, 822 and 823 that can distinguish real faults from normal system changes.

In one embodiment, a fault threshold for a given sequence value, for instance $I_A^-$, may be set to a specified fraction of the RMS current for line-phase A. Alternatively, the Positive Sequence values $I_A^+$, $I_B^+$ and $I_C^+$ as computed by the matrices in FIG. 7 can provide the basis for setting fault thresholds. A system defined fraction of the Positive Sequence value $I_A^+$ may specify the fault threshold for the Negative Sequence value $I_A^-$, and correspondingly for $I_B^+$ and $I_B^-$ and for $I_C^+$ and $I_C^-$. In any case where a threshold is defined as a fraction of a current or sequence value, system stability may demand that the threshold never be less than some minimum value.

Figure 9:
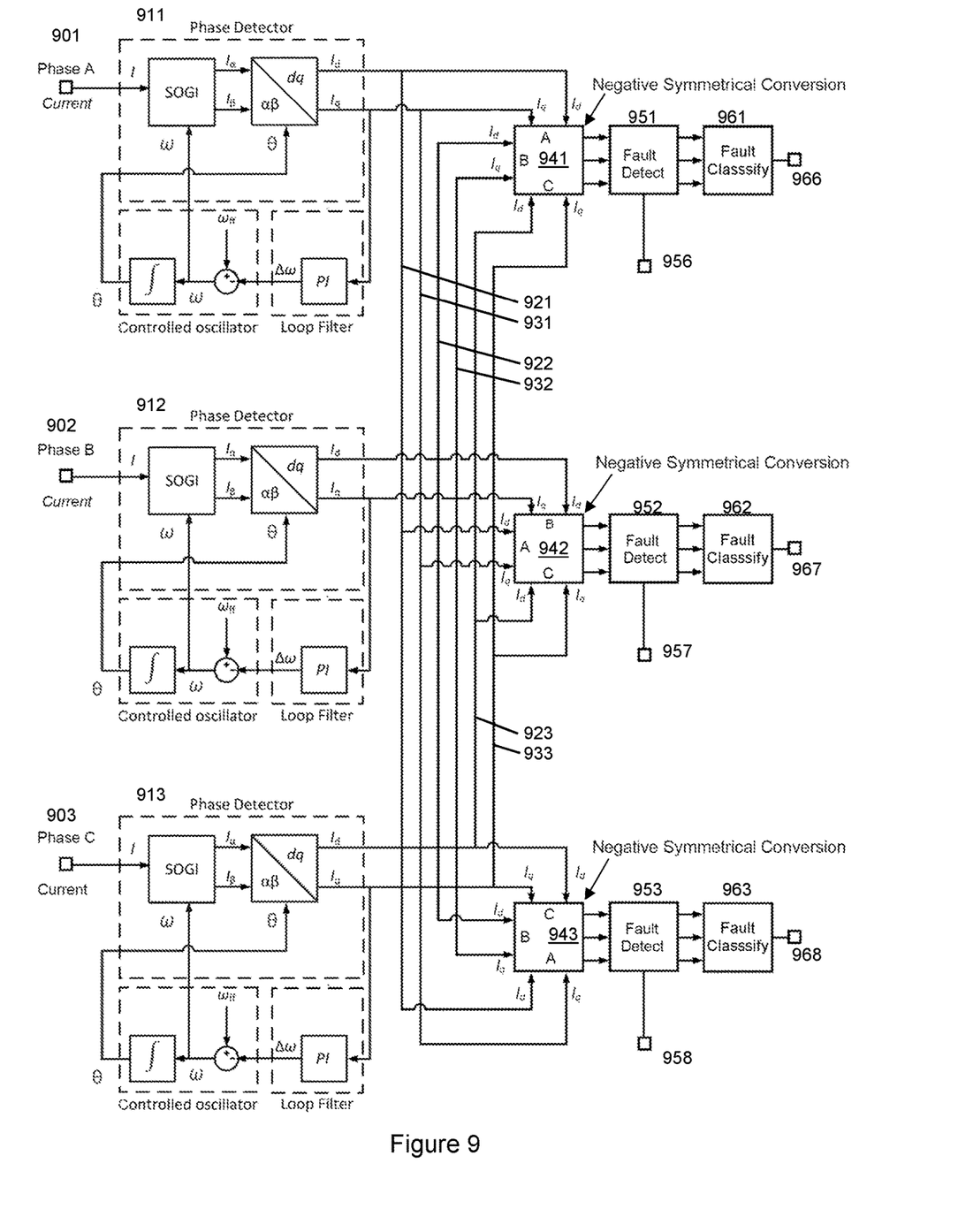
FIG. 9 is a block diagram illustrating a three-phase system to detect faults indicated by line-phase imbalance conditions.

In FIG. 3, a high-level block diagram of the transmission line fault detection system, and the subsequent figures have detailed some parts of the major blocks in that system. FIG. 9 contains details omitted in FIG. 3. For instance, blocks 901, 902 and 903 provide the inputs, which may include current pick-ups from the three respective transmission lines, and in some embodiments, analog-to-digital conversions, as indicated in FIG. 5. The blocks indicated as line current monitors 311, 312 and 313 in FIG. 3 are identified as blocks 911, 912 and 913 in FIG. 9. These blocks are detailed in FIGS. 4 and 5, and their role is to create $I_d$ and h, in-phase and quadrature representations of the line-phase currents in a rotating time frame.

In some embodiments, fault detection modules 321, 322 and 323 in FIG. 3 are represented in FIG. 9 by blocks 941, 951 and 961, 942, 952 and 962, and finally 943, 953, 963. These blocks have the function of using the three sets of in-phase and quadrature signals, $I_d$ and $I_q$ to detect and classify faults in the power transmission system.

Fault detection has been addressed in the discussion of FIG. 8, which is simplified for each line-phase as 941 and 951 for line-phase A, 942 and 952 for line-phase B and 943 and 953 for line-phase C. Immediately upon detecting a fault, a signal must be presented via at least one terminal 956, 957 or 958. This signal may be used to neutralize local impedance modification, neutralize impedance modification in closely related line-phases, and to notify the central transmission control system of the existence of a fault.

In FIG. 9, blocks 961, 962 and 963 are dedicated to classifying a fault, once detected. Considering just one of the three fault classifying blocks, say 962, this block may use the negative sequence values $I_A^-$, $I_B^-$ and $I_C^-$ as computed in block 942 to classify the detected fault. Classifying faults may involve comparing time-dependent $I_A^-$, $I_B^-$ and $I_C^-$ patterns with a catalog of fingerprints, characteristic patterns associated with various types of faults. More sophisticated identification may be achieved by using additional real-time data, like positive sequence current components $I_A^+$, $I_B^+$ and $I_C^+$. Other forms of identification, like artificial intelligence, may be employed. The fault classification data from block 962 may be made available to a system controller or other system management system through the port 967.

Referring back to FIG. 3 as guidance to FIG. 9, it is noted that the line electronics to the left need to be connected to the error detection electronics on the right. Block 333 in FIG. 3 provides communications among the line-phase electronics, since the fault detection modules 321, 322 and 323 use $I_d$ and $I_q$ signals from all phases in order to detect and classify faults. In FIG. 9, the inter-phase communication is indicated by the connection lines 921 and 931, which carry $I_d$ and $I_q$ signals from line-phase A, lines 922 and 932, which carry $I_d$ and $I_q$ signals from line-phase B, and lines 923 and 933, which carry $I_d$ and $I_q$ signals from line-phase C. In a direct connection as implied by FIG. 9, the inter-phase connection lines may be buses with 8 to 16 bit carrying lines. More probably, connection lines 921, 931, 922, 932, 923 and 933 could be serial data lines using any common serial protocol, like SPI, USB or even Ethernet. The significant disadvantage of any sort of wired connection in this context is the expectation of hundreds or thousands of volts in potential difference among the electronics blocks. Galvanic isolation of the communications lines is impractical above roughly 10 kV, a figure that can be achieved with some opto-isolators.

Direct connections, as implied by FIG. 9 may be more effectively realized by fiber optics, generally with serial data transmission. Fibers are intrinsically insulating, and they are capable of very high bandwidths. Since there are six different signals, they may be distributed on different fibers, as connection lines 921, 931, 922, 932, 923 and 933 for instance, or one might use time division multiplexing with one, two or three fibers. With optical fiber, there is also the option of wavelength division multiplexing.

Figure 10:
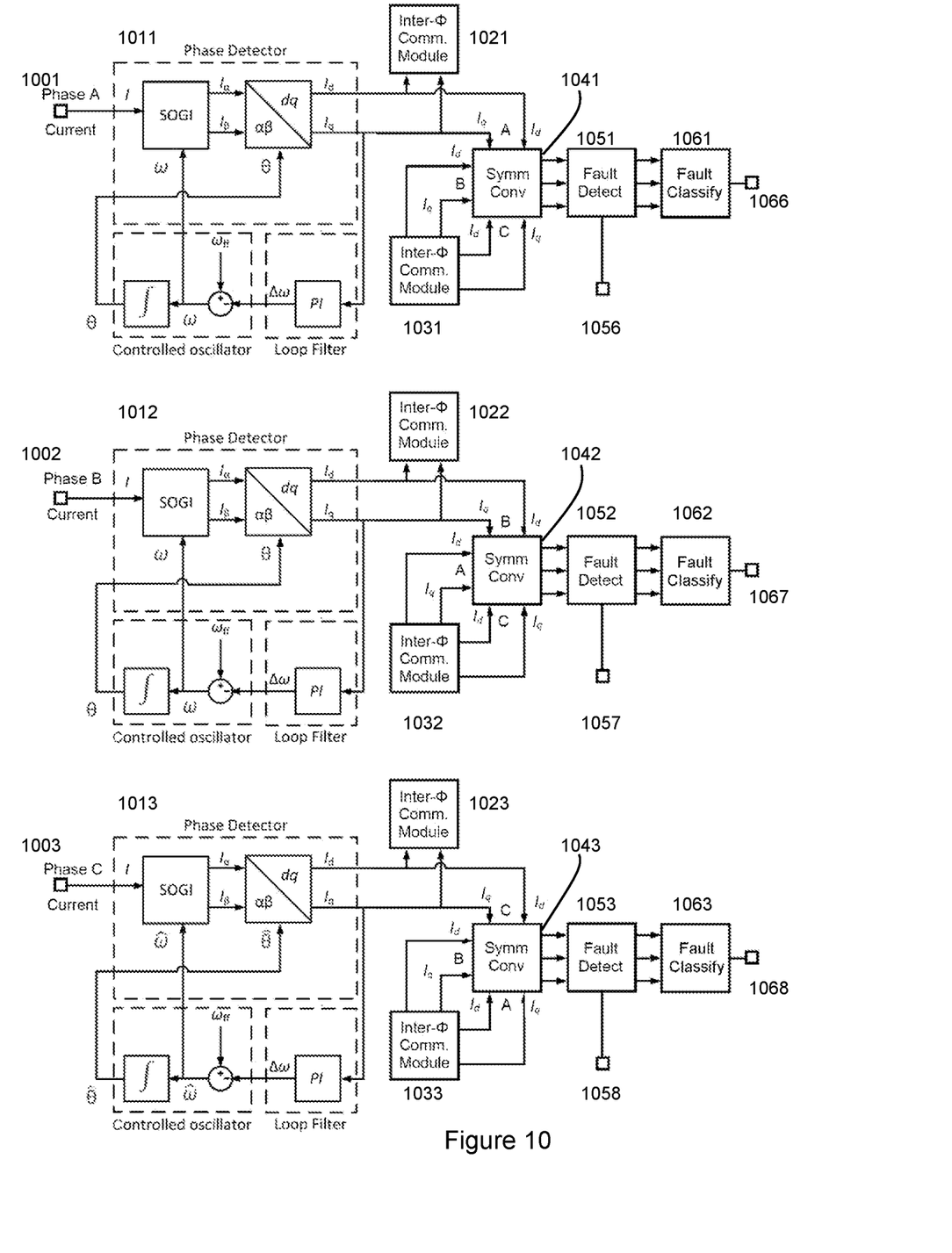
FIG. 10 is a block diagram illustrating a three-phase system to detect faults indicated by line-phase imbalance conditions, using RF communications among the phases.

A more favorable option for inter-phase communications may be the use of radio communications, as illustrated in FIG. 10. The difference between FIG. 10 and FIG. 9 is the replacement of direct inter-phase connections with radio communications among the phases. Inter-phase communication modules 1021, 1022 and 1023 can have the functions of accepting $I_d$ and $I_q$ signals, formatting them according to a communications protocol, and then transmitting those signals on a radio frequency carrier to the inter-phase communication modules 1031, 1032 and 1033. Module 1031 has the role of receiving the RF signals from modules 1022 and 1023, and extracting from those RF signals $I_d$ and $I_q$ for line-phase B and $I_d$ and $I_q$ for line-phase C. Similarly, inter-phase communications module 1032 has the role of receiving the RF signals from modules 1021 and 1023, and extracting from those RF signals $I_d$ and $I_q$ for line-phase A and $I_d$ and $I_q$ for line-phase C. Inter-phase communications module 1033 has the role of receiving the RF signals from modules 1021 and 1022, and extracting from those RF signals $I_d$ and $I_q$ for line-phase A and $I_d$ and $I_q$ for line-phase B.

The RF carrier frequency for inter-phase communications may be selected from a wide variety of bands, including 2.45 GHz (2.4-2.5 GHz), 5.8 GHz (5.725-5.875 GHz), and 24.125 GHz (24-24.25 GHz), 61.25 GHz (61.0-61.5 GHz), 65 GHz (64-66 GHz), 70 GHz (71-76 GHz), 80 GHz (81-86 GHz) and 122.5 GHz (122-123 GHz). The selection of a band depends upon the relevant national regulations, physical distances among the line-phases, atmospheric attenuation, and interference considerations.

The fact that the signals $I_d$ and $I_q$ used for communication among the line-phases are referenced to a rotating time frame means that they tend to change slowly compared to the operating frequency cycle time. Assuming these signals are represented by sequences of words 8 to 16 bits in length for example, and the sampling rate is 1,000,000 per second, each $I_d$, $I_q$ pair may be 16 megabits per second. The relative stability of the $I_d$ and $I_q$ signals means that an opportunity exists to simplify the inter-phase communication by using encoders in the transmitting communication modules 1021, 1022 and 1022, paired with decoders in the receiving modules 1031, 1032 and 1033. These encoder/decoder pairs may reduce the bit rate, allowing the use of lower carrier frequencies in RF links or less expensive optical modulators and demodulators in fiber optic connections.

Another refinement that may be incorporated in the inter-phase communication is time tagging. Certain serial data transmission protocols use frames to keep data organized. For instance, the STS protocols are built upon 125 μsec frames, which implies that certain words may be delayed by up to 125 μsec. The use of symmetric transform matrices implies that the six input signals are temporally synchronized. An extremely accurate clock is available worldwide from a global positioning system (GPS) satellite network. GPS signals may be used to time tag each $I_d$, $I_q$ word, and that time tag may be used at the receiving end, just prior to entry into any of the symmetric conversion matrices, to assure that the three each $I_d$, $I_q$ pairs represent the same time. A temporal precision of 1/1,000 of a cycle may be the least precision one may use for error detection, so that implies at least 16.7 μsec temporal precision for 60 Hz lines or 20 μsec precision for 50 Hz lines. GPS signals may be readily used for time tagging to a precision of 100 nsec. For each of the fault detection modules, there is one $I_d$, $I_q$ pair that may not be subjected to the vagaries of the inter-phase communications. However, the data from that, a proximate rotating frame transformation, must also be time tagged.

FIGS. 3, 9 and 10 illustrate a case where the fault detection module is replicated three times, once for each line-phase. Part of the rationale for this apparent redundancy is the need to detect and respond to a fault in a time that is short compared to a cycle of the transmission frequency. The use of the negative symmetric conversion assures that an unbalanced fault condition may be detected independently of the portion of the cycle in which it occurs. The redundant fault detection modules assure prompt response, and they may also provide confirmation when a fault is simultaneously detected by two or more fault detector modules 321, 322 and 323, blocks 951, 952 and 953 or blocks 1051, 1052 and 1053. In those applications where the cost of redundancy is not justified, the system may be configured as shown in FIG. 11.

Figure 11:
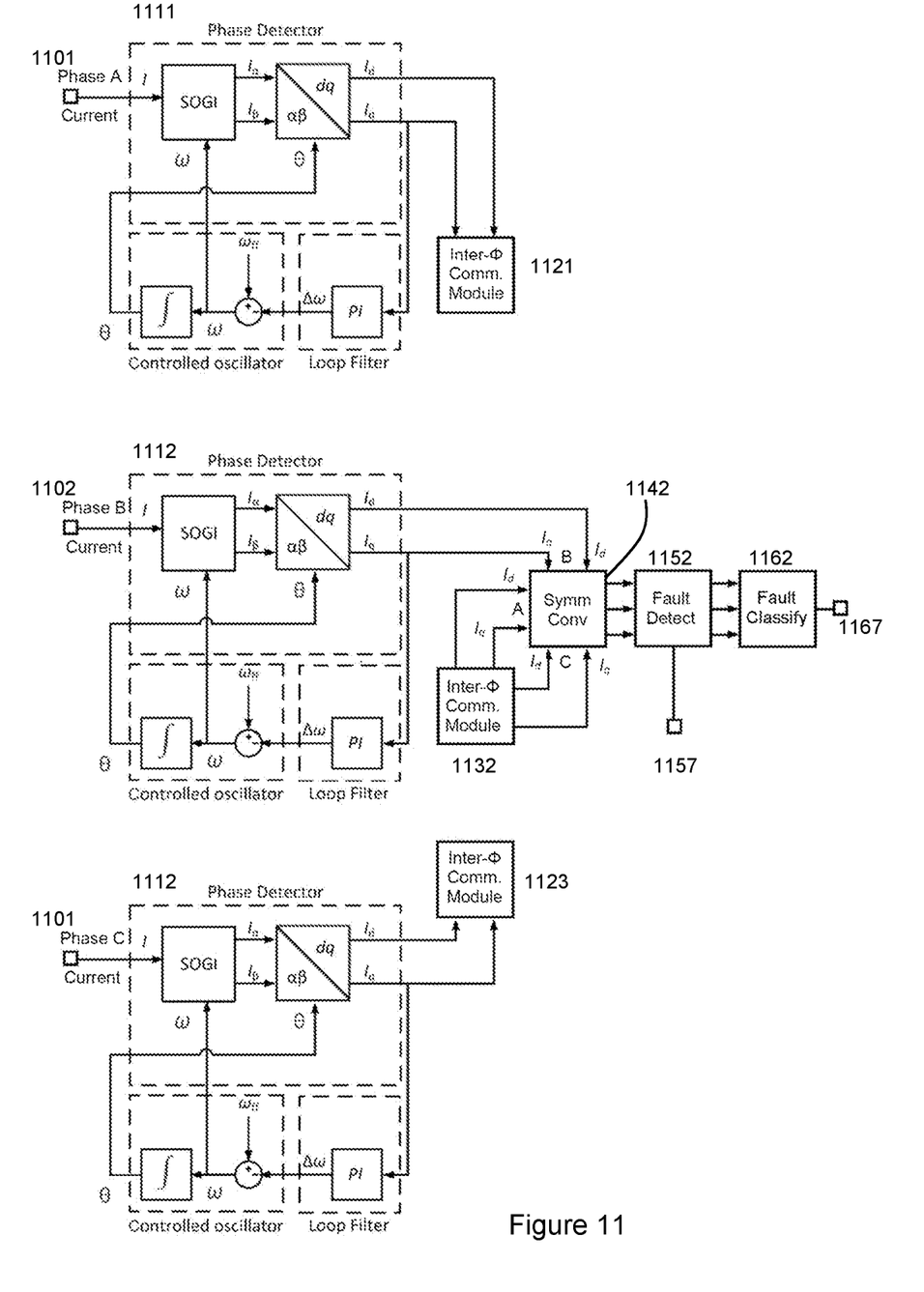
FIG. 11 is a block diagram illustrating a three-phase system to detect faults indicated by line-phase imbalance conditions, with a single fault sensing chain, and using RF communications among the three transmission line phases.

In FIG. 11, a single fault detecting suite which may include a single negative symmetric conversion 1142, a single fault detector 1152 and a single fault classifier 1162. In this example, the fault detection suite is associated with line-phase B. It can be associated with line-phase A or line-phase C. In this case, the inter-phase communication may be simplified to include two inter-phase communication modules 1121 and 1123 that are configured to transmit $I_d$ and $I_q$ signals, and a single inter-phase communication module 1132, configured to receive and synchronize the information from 1121 and 1123.

In the embodiments illustrated in FIGS. 9, 10 and 11, the low rate of change of $I_d$ and $I_q$ under non-fault conditions, simplifies the inter-phase communications. If other line-phase related data, like RMS current values, are required for fault threshold adaptation or fault classification, that information may be multiplexed in with the six $I_d$ and $I_q$ signals. Another housekeeping item concerns providing operating power for the fault detection. There is a well-established practice of using a transformer in which the primary is the power line and the secondary supplies the scavenged energy to a power supply scaled to provide the appropriate voltage and current to the total fault detection and classification system described here.

It is intended that the various configurations described herein shall be illustrative, but not limiting. The scope of the invention is defined by the claims below.

What is claimed is:

1. A fault detection system, comprising:
a plurality of line current monitors, each line current monitor to couple to one of a plurality of line-phases of an electric power transmission system;
each line current monitor comprising:
a phase detector with rotating frame transform, to couple to a line-phase and provide in-phase and quadrature signals in a rotating frame, based on in-phase and quadrature signals proportional to current in the line-phase;
a loop filter coupled to the phase detector; and
a controlled oscillator coupled to the loop filter and coupled to the phase detector as a phase locked loop;
one or more inter-phase communication modules coupled to the plurality of line current monitors, with electrical isolation; and
one or more fault detection modules coupled to the one or more inter-phase communication modules;
wherein the one or more fault detection modules are to indicate error or fault detected in the electric power transmission system based on signals of the plurality of line current monitors communicated through the one or more inter-phase communication modules to the one or more fault detection modules.

2. The fault detection system of claim 1, wherein:
the phase detector, the loop filter and the controlled oscillator each comprises analog circuitry in a closed loop that forms the phase locked loop.

3. The fault detection system of claim 1, wherein:
the phase detector, the loop filter and the controlled oscillator each comprises digital circuitry; and
the one or more inter-phase communication modules are to communicate, to the one or more fault detection modules, the in-phase and quadrature signals in a frame that is rotating at a nominal line frequency, as the rotating frame, from the phase detector of each line current monitor.

4. The fault detection system of claim 1, wherein:
the phase detector, the loop filter and the controlled oscillator each comprises analog circuitry; and
the one or more inter-phase communication modules are to communicate, to the one or more fault detection modules, the in-phase and quadrature signals in a frame that is rotating at a nominal line frequency, as the rotating frame, from the phase detector of each line current monitor.

5. The fault detection system of claim 1, wherein the phase detector with rotating frame transform comprises:
an integrator circuit to provide the in-phase and quadrature signals proportional to the current in the line-phase and relative to a reference signal generated by the controlled oscillator; and
a conversion block to transform the in-phase and quadrature signals to the in-phase and quadrature signals in the rotating frame, with the frame rotating at a nominal line frequency defined by the controlled oscillator.

6. The fault detection system of claim 1, wherein the phase locked loop comprises:

a second order generalized integrator (SOGI) circuit to couple to the line-phase; and
a Park Transformation block coupled to the SOGI circuit.

7. The fault detection system of claim 1, wherein the line current monitor includes a line current sensing device to couple to the line-phase and provide a signal proportional to instantaneous current passing through the line-phase.

8. The fault detection system of claim 1, wherein the loop filter comprises a low-pass loop filter to input a quadrature signal from the rotating frame transform of the phase detector and output a correcting signal to the controlled oscillator.

9. The fault detection system of claim 1, wherein the one or more fault detection modules comprises a Clarke transform with positive sequence equations or negative sequence equations and one or more outputs that are compared to one or more reference signals or one or more thresholds.

10. The fault detection system of claim 1, wherein the one or more fault detection modules comprises one or more fault classifying blocks.

11. The fault detection system of claim 1, wherein the one or more inter-phase communication modules comprises opto-isolators or fiber optics.

12. The fault detection system of claim 1, wherein the one or more inter-phase communication modules comprises radio communication.

13. The fault detection system of claim 1, wherein the one or more inter-phase communication modules comprises a serial data transmission protocol and time tagging.

14. The fault detection system of claim 1, wherein the plurality of line current monitors comprises three line current monitors and the plurality of line-phases comprises three line-phases, the three line current monitors to respectively couple to the three line-phases.

15. The fault detection system of claim 1, wherein the one or more fault detection modules comprises a single negative symmetric conversion, a single fault detector and a single fault classifier.

16. The fault detection system of claim 1, wherein the one or more fault detection modules comprises a reference controller to manage reference signals and provide thresholds to distinguish real faults from normal system changes.

17. A fault detection system for line-phases of electric power transmission systems, comprising:
a plurality of line current monitors, each line current monitor comprising:
a controlled oscillator, to produce a reference signal;
a phase detector having a second order generalized integrator (SOGI) circuit to couple to a line-phase and to provide in-phase and quadrature alternating current signals proportional to current in the line-phase and relative to the reference signal produced by the controlled oscillator, and a Park Transformation block coupled to the SOGI circuit to transform the in-phase and quadrature alternating current signals to in-phase and quadrature signals in a rotating frame, with the frame rotating at a nominal line frequency defined by the controlled oscillator; and
a loop filter coupling the phase detector and the controlled oscillator in a phase locked loop;
one or more fault detection modules, to detect error or fault in the line-phases of the electric power transmission system based on the plurality of line current monitors; and
one or more inter-phase communication modules to provide electrical isolation and couple to the one or more fault detection modules and the plurality of line current monitors.

18. The fault detection system of claim 17, wherein the plurality of line current monitors comprises analog circuitry.

19. The fault detection system of claim 17, wherein the plurality of line current monitors comprises digital circuitry.

20. A method of fault detection, performed by a fault detection system, comprising:

determining in-phase and quadrature signals proportional to current in a line-phase of an electric power transmission system and relative to a reference signal generated by a controlled oscillator in a phase locked loop, in each of a plurality of line current monitors;

transforming the in-phase and quadrature signals to in-phase and quadrature signals in a rotating frame, the frame rotating at a line frequency according to the controlled oscillator, in each of the plurality of line current monitors;

communicating output of the plurality of line current monitors, through one or more inter-phase communication modules coupled to the plurality of line current monitors with electrical isolation, to one or more fault detection modules; and detecting and indicating error of one or more line-phases of the electric power transmission system, through the one or more fault detection modules, based on the output of the plurality of line current monitors communicated through the one or more inter-phase communication modules to the one or more fault detection modules.

21. The method of claim 20, wherein detecting the error of the one or more line-phases of the electric power transmission system comprises employing a positive or negative Clarke symmetric conversion to compare current amplitudes and phases.

22. The method of claim 20, further comprising carrying current information from the plurality of line current monitors to the one or more fault detection modules as in-phase and quadrature amplitudes in a rotating time frame.

* * * * *